(12) United States Patent
Lester et al.

(10) Patent No.: US 6,806,110 B2
(45) Date of Patent: Oct. 19, 2004

(54) MONOLITHIC MULTI-WAVELENGTH VERTICAL-CAVITY SURFACE EMITTING LASER ARRAY AND METHOD OF MANUFACTURE THEREFOR

(75) Inventors: Steven D. Lester, Palo Alto, CA (US); Virginia M. Robbins, Los Gatos, CA (US); Jeffrey N. Miller, Los Altos Hills, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/151,646

(22) Filed: May 16, 2002

(65) Prior Publication Data

US 2003/0214992 A1 Nov. 20, 2003

(51) Int. Cl.$^7$ ............................................. H01L 21/00
(52) U.S. Cl. ........................................ 438/28; 438/34
(58) Field of Search ...................... 438/21–47, 706–744

(56) References Cited

U.S. PATENT DOCUMENTS

| | | | |
|---|---|---|---|
| 5,291,502 A | 3/1994 | Pezeshki et al. | |
| 5,739,945 A | 4/1998 | Tayebati | |
| 5,991,326 A | * 11/1999 | Yuen et al. | 372/96 |
| 6,324,192 B1 | * 11/2001 | Tayebati | 372/20 |
| 6,341,137 B1 | 1/2002 | Jayaraman et al. | |
| 2002/0131464 A1 | * 9/2002 | Sirbu et al. | 372/45 |
| 2003/0033122 A1 | * 2/2003 | Wang et al. | 372/45 |
| 2003/0039284 A1 | * 2/2003 | Zheng et al. | 372/45 |

FOREIGN PATENT DOCUMENTS

WO    WO 99/34484    7/1999

OTHER PUBLICATIONS

Seassal, C. et al., "Micromachined Structures for Vertical Microelectrooptical Device on InP", Indium Phosphide and Related Materials, Apr. 21–25, 1996, pp. 275–278.

Eng, L.E. et al., "Wavelength Shift in Vertical Cavity Laser Arrays on a Patterned Substrates", Electronics Letters, No. 31, No. 7, Mar. 30, 1995, pp. 562–563.

Koyama, F. et al., "Two–Dimensional Multiwavelength Surface Emitting Laser Arrays Fabricated by Nonplanar MOCVD", Electronics Letters, vol. 30, No. 23, Nov. 10, 1994, pp. 1947–1948.

Huffaker, D.L. et al., "Multiwavelength, Densely–Packed 2 x 2 Vertical–Cavity Surface_Emitting Laser Array Fabricated Using Selective Oxidation", IEEE Photonics Technology Letters, vol. 8, No. 7, Jul. 1, 1996, pp. 858–860.

Mauro J. Kobrinsky, Erik R. Deutsch, and Stephen D. Senturia, "Effect of Support Compliance and Residual Stress on the shape ofb Doubly Supported Surface–Micromachined Beams", Journal of Microelectromechanical Systems, vol. 9, No. 3, pp. 361–369, Sep. 2000.

\* cited by examiner

*Primary Examiner*—Savitri Mulpuri

(57) ABSTRACT

A monolithic array of vertical cavity lasers with different emission wavelengths on a single wafer, and method of manufacture therefor, is provided. A first reflector is over the semiconductor substrate with a photoactive semiconductor layer. A reflector support defines first and second air gaps with the photoactive semiconductor layer. The second and third air gaps are made to be different from each other by geometric differences in the reflector support structure. Second and third reflectors are formed over the reflector support whereby a first laser is formed by the first reflector, the photoactive semiconductor structure, the first air gap, and the second reflector and whereby a second laser is formed by the first reflector, the photoactive semiconductor structure, the second air gap, and the third reflector. The emission wavelengths of the first and second lasers are different because of the different sizes of the first and second air gaps.

10 Claims, 4 Drawing Sheets

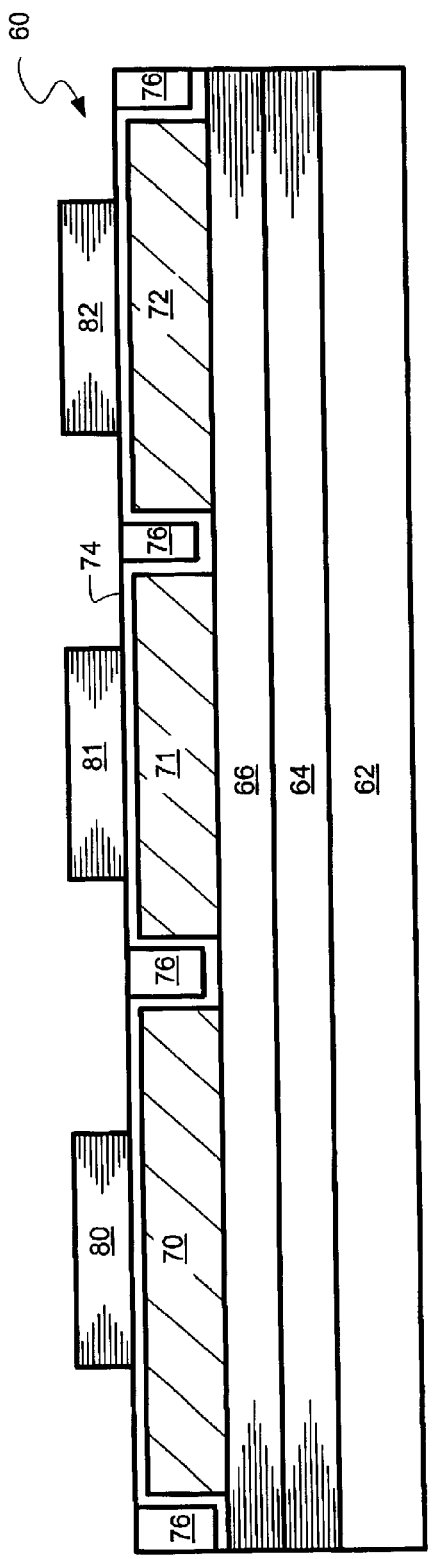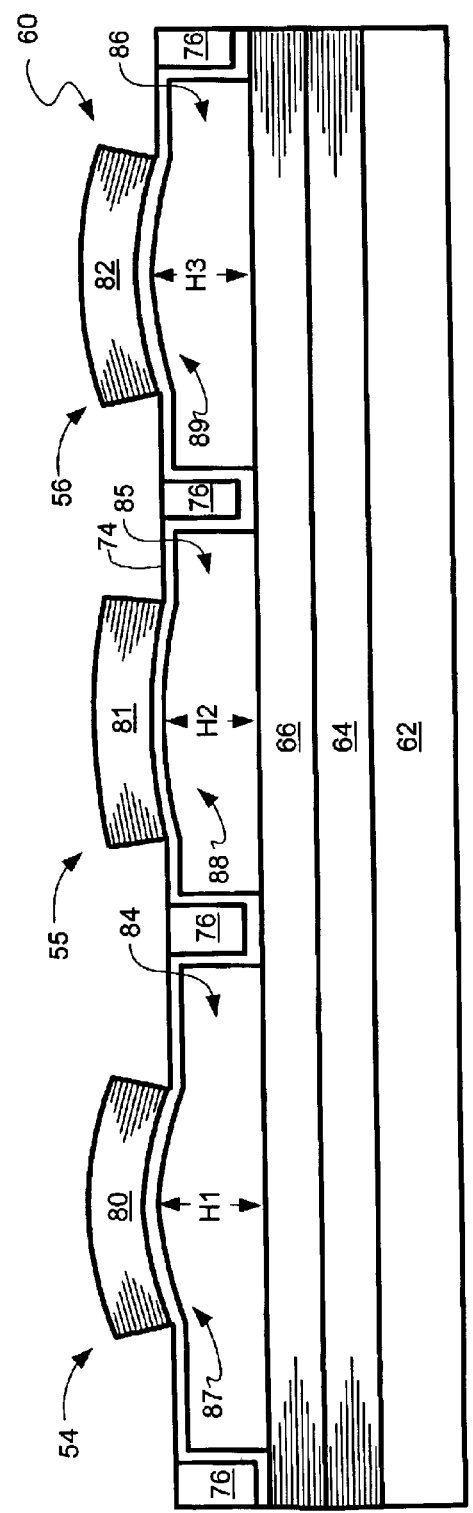

MONOLITHIC MULTI-WAVELENGTH VERTICAL-CAVITY SURFACE EMITTING LASER ARRAY AND METHOD OF MANUFACTURE THEREFOR

BACKGROUND

1. Technical Field

The present invention relates generally to vertical cavity lasers, and more specifically to monolithic arrays of vertical cavity lasers.

2. Background Art

Vertical cavity surface emitting lasers (VCSELS) are semiconductor devices, which are revolutionizing the field of telecommunications. They generally consist of a pair of semiconductor mirrors defining a resonant cavity containing a gain medium of semiconductor materials for amplifying light.

VCSELs have relatively high efficiency, small size, low weight, low power consumption, and the capability to be driven by low-voltage power. They can operate in a single longitudinal mode, or frequency, and produce a circular beam of laser light that can easily be coupled into optical fibers. The surface emission feature allows devices to be packed densely on a wafer, so that two-dimensional arrays are fabricated relatively easily.

VCSELS use semiconductor materials comprised of elements such as aluminum, indium, gallium, arsenic, nitrogen, and phosphorous as the gain medium, and alternating high and low index of refraction materials such as silicon and silicon dioxide for the semiconductor mirrors or distributed Bragg reflectors (DBRs).

The lasing wavelength of a VCSEL is determined by the optical height of its resonant cavity. Most commonly the optical height, and thus the wavelength, is determined by the thicknesses of the semiconductor layers in the devices. These thicknesses are set during the growth of the semiconductor layers and are nominally the same for all the VCSELs on given wafer.

The resonant cavity of some VCSELs also includes an air gap, where the size of the air gap partly determines the lasing wavelength.

A monolithic multiple-wavelength VCSEL array requires side-by-side fabrication of VCSELs on a wafer where the VCSELs need to be exactly the same except with controlled, different lasing wavelengths. This presents a problem because the processing used on the wafer must assure that the threshold gain at which lasing begins, the current usage, the efficiency, the losses of light in the resonant cavity, the amplification of the gain material, and the light transmission of the DBR all remain the same. At the same time, the same processing must produce different lasing wavelengths, which is most commonly realized by changing the optical height of the resonant cavity.

One prior art method to making a monolithic multiple wavelength VCSEL array is non-uniform growth due to thermal gradient. The backside of a substrate is patterned prior to epitaxial growth in a molecular beam epitaxy reactor. The resulting backside pattern produces a thermal gradient on the surface of the substrate when the wafer is heated. Because growth rate is temperature dependent, there is a variable material thickness and hence a variable laser wavelength along the thermal gradient. One disadvantage of this approach is the fact that the arrays are limited to linear geometries. To date, there have been problems controlling the wavelengths precisely and repeatedly over large areas of the wafer.

An alternate prior art method is laterally confining each laser prior to epitaxial growth by either etching a mesa or patterning windows in an oxide mask. This process is known as "selective area growth". Growth rate and composition are functions of the lateral dimension. The method is problematic because it is sensitive to growth conditions and may vary from reactor to reactor or from growth to growth. In both of the aforementioned prior art methods, the proximity of different wavelength devices in an array is limited.

Another prior art method is to grow a partial VCSEL structure including the lower DBR, the gain material, and some part of the upper DBR. The wafer is masked and anodically oxidized to some controlled oxide thickness over the exposed portions. A selective etch is then used to remove the oxide. This process is repeated to create different effective resonant cavity lengths for each laser in an array. The remainder of the VCSEL structure is regrown over the patterned wafer. Besides requiring a large number of process steps, each etch is sensitive to voltage and concentration variations that cause problems, which affect the depth, resulting in reduced control over wavelength spacing between devices.

Another prior art method is to grow a partial VCSEL structure including the lower DBR, the gain material, and a series of etch-stop layers that can be selectively etched away. The wafer is repeatedly masked and etched so that different amounts of material are removed from the different VCSELs in the array. The wafer is then re-introduced into the semiconductor growth apparatus and the deposition of the remaining layers is performed. This approach requires multiple masking and etching steps to achieve the different etch depths. This becomes unmanageable when the number of VCSELs is greater than a few. In addition, this process requires the upper portion of the semiconductor material must be epitaxially re-grown after the etching process is complete. This increases both the complexity and the cost of the fabrication process.

Despite the large number of methods developed, a method that provides VCSELs having the same accuracy as planar epitaxial growth and not requiring a large number of masking steps or multiple epitaxial growths has long been sought but has long eluded those skilled in the art.

SUMMARY OF THE INVENTION

The present invention provides a monolithic array of vertical cavity lasers with different emission wavelengths on a single wafer, and method of manufacture therefor. A first reflector is over the semiconductor substrate with a photoactive semiconductor layer. A reflector support defines first and second air gaps with the photoactive semiconductor layer. The second and third air gaps are made to be different from each other by geometric differences in the reflector support structure. Second and third reflectors are formed over the reflector support whereby a first laser is formed by the first reflector, the photoactive semiconductor structure, the first air gap, and the second reflector and whereby a second laser is formed by the first reflector, the photoactive semiconductor structure, the second air gap, and the third reflector. The emission wavelengths of the first and second lasers are different because of the different sizes of the first and second air gaps. Only one mask is required to set the air gaps for an array containing an arbitrary number of lasers.

The above and additional advantages of the present invention will become apparent to those skilled in the art from a reading of the following detailed description when taken in conjunction with the accompanying drawings.

BRIEF DESCRIPTION OF THE DRAWINGS

FIG. 3 is a cross-sectional view of a VCSEL array made with the present invention in one stage of manufacturing;

FIG. 4 is the cross-sectional view of the VCSEL array of FIG. 3 in one embodiment of the present invention;

DETAILED DESCRIPTION OF THE INVENTION

For purposes of the present invention, the vertical resonant cavity device is referred to as a vertical cavity optical device (VCOD). This is because in addition to VCSELs the invention can also be used to make monolithic arrays of detectors, Fabry-Perot filters, or other optical devices that require a range of resonant cavity wavelengths within the array.

In addition, for purposes of convenience, the term "horizontal" as used in herein is defined as a plane parallel to the conventional plane or surface of a wafer upon which the VCODs are formed regardless of the orientation of the wafer. The term "vertical" or "thickness" refers to a direction perpendicular to the horizontal as just defined. Terms, such as "on", "above", "below", "upper", "lower", "over", and "under", are defined with respect to the horizontal plane. The descriptions of the positions of the various elements in the various embodiments are not intended to be limiting and many other positions would be evident to those skilled in the art.

Figure 1:
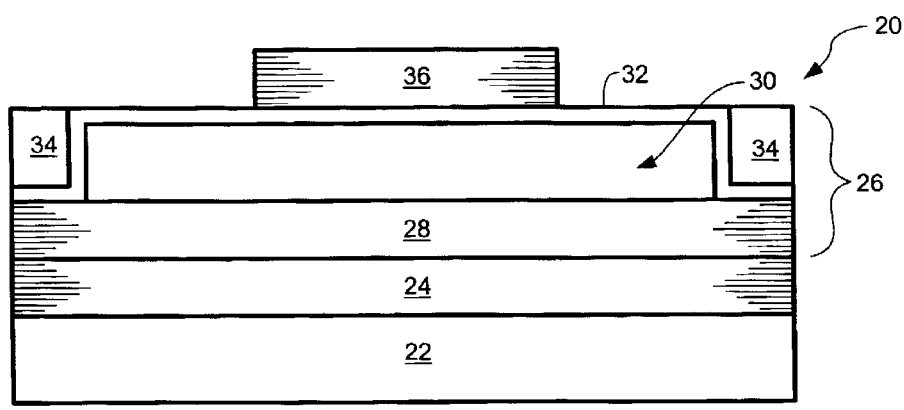
FIG. 1 (PRIOR ART) is a cross-sectional view of a prior art vertical cavity surface emitting laser.

Referring now to FIG. 1 (PRIOR ART), therein is shown a cross-sectional view of a prior art vertical cavity surface emitting laser or VCSEL 20. Above the substrate 22 is a lower mirror or distributed Bragg reflector (DBR) 24, which consists of a plurality of alternating high and low index of refraction materials. The DBR 24 can be made from a number of different combinations of materials including semiconductor layers, dielectric materials such as $TiO_2$ and $SiO_2$, or hybrid combinations of semiconductor, dielectric and metal layers. Each of the layers has an optical thickness of ~¼ of a wavelength and the layers are combined until the DBR 24 has an overall reflectance of almost 100%.

Above the DBR 24 is a vertical resonant cavity 26, which consists of a photoactive semiconductor structure 28 and an air gap 30. In the case that the VCOD is a VCSEL the photoactive semiconductor structure contains a quantum well or quantum wells for providing laser light. The air gap 30 is the space above the photoactive semiconductor structure 28 and below a reflector support 32 and held by an anchor 34. The heights or thicknesses of the photoactive semiconductor structure 28, the air gap 30, and the reflector support 32 are chosen so their optical thickness are approximately multiples of $\lambda/4$ so the vertical resonant cavity 26 has a total height, which is an integral multiple of $\lambda/2$.

The reflector support 32 can be made of a material such as silicon nitride, an organic polymer, or it can be a semiconductor material. Mounted on and above the reflector support 32 is an upper mirror or DBR 36, comprised of alternating layers of $\sim\lambda/4$ thick low and high index of refraction materials that reflect light from the DBR 36 back to the DBR 24.

Depending upon the relative reflectivity of the DBRs 24 and 36, light will be emitted upward through the DBR 36 or downward through the DBR 24 and the substrate 22. The wavelength of the light will be the same for all VCSELs on the same wafer and a different wavelength will require a different wafer where the vertical resonant cavities will all be of a different height.

Figure 2:
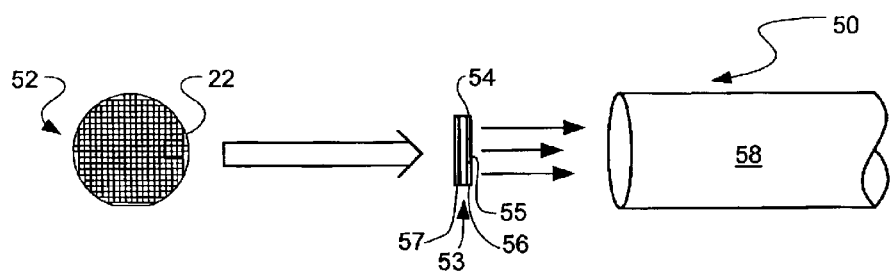
FIG. 2 is a schematic illustration of an optical communication system assembled according to the present invention.

Referring now to FIG. 2, therein is shown a schematic illustration of how an optical communication system 50 is assembled according to the present invention. A single wafer 52 is processed according to the present invention so a plurality of VCODs is formed having different vertical resonant cavities.

The wafer 52 is then sliced into a monolithic VCSEL array 53, which include a plurality of VCODs 54, 55, and 56. The VCODs 54, 55, and 56 are connected by circuitry (not shown) which provide laser light at respective first, second, and third different wavelengths into a fiber optic cable 58. The VCODs 54, 55, and 56 are packaged into a common package 57.

Referring now to FIG. 3, therein is shown a cross-sectional view of a monolithic VCSEL array 60 of the present invention in one stage of manufacturing.

The array 60 includes a substrate 62. Above the substrate 62 is a lower mirror or lower DBR 64, which consists of a plurality of alternating high and low index of refraction materials. The lower DBR 64 can be made from a number of different combinations of dielectric layers, such as $SiO_2$, SiC, $TiO_2$, and A1203, they can be semiconductor layers, or they could be combinations of semiconductors, dielectric materials, and metal. Each of the layers is ~¼ of a wavelength (Š/4) in optical thickness and the layers are combined until the lower DBR 64 has an overall reflectance of almost 100%.

Above the lower DBR 64 is a photoactive semiconductor structure 66, which contains quantum wells as previously described. The quantum well may be a single quantum well or multiple quantum wells with a number of alternating thin layers of high- and low-bandgap semiconductor materials. The photoactive semiconductor structure 66 is made from multiple layers of materials such as those containing aluminum, indium, gallium, arsenic, nitrogen, and/or phosphorous.

Above the photoactive semiconductor structure 66 is a sacrificial layer, which has been formed into sacrificial islands 70–72 using standard lithography and etching processes. The sacrificial islands 70–72 can have different shapes, but in one mode, they are disk-shaped and have different diameters to allow control of the optical characteristics of the final VCODs as will later be explained. The sacrificial islands 70–72 are deposited on the photoactive semiconductor structure 66 and are of an etchable material, such as polyimide, which can readily be removed in an oxygen plasma. Alternately, they can be made of semiconductor layers that can be removed by selective etching.

A reflector support 74 is deposited on the photoactive semiconductor structure 66 and covers the sacrificial islands 70–72. The reflector support 74 can be made of a material such as silicon nitride, an organic polymer, or it can be a semiconductor material. An anchor 76 is deposited on the reflector support 74 where it is attached to the photoactive semiconductor structure 66. The anchor 76 can be made with the same materials as the top DBRs 80–82, it can be made of dielectrics such as $SiO_2$ or $Si_3N_4$, or it can be a metal such as gold or aluminum.

The materials used to form the upper DBRs 80–82 are deposited to cover the reflector support 74 and the anchor 76. These layers are alternating layers of low and high index of refraction materials that will be etched to form the upper mirrors or upper DBRs 80–82. The DBRs 80–82 can be made from dielectric materials such as $SiO_2$, SiC, $TiO_2$, and $Al_2O_3$, or they can be semiconductor layers, or they could be combinations of semiconductors, dielectric materials, and metal. There are a number of ways to deposit these materials such as plasma deposition, evaporation, sputtering, ion assisted deposition, or epitaxial growth.

The upper DBRs 80–82 can have different shapes and sizes, but in the one preferred mode, they are disks having the same diameters centrally placed on portions of the reflector support 74 having different diameters.

The upper DBR materials and the materials used for the reflector support 74 will contain residual stresses, either tensile or compressive. The existence of the residual stresses in these layers is evident to those having ordinary skill in the art. The stresses can be tailored in a variety of ways during the deposition of the films. In plasma deposition, various factors such as gas flows, temperature, and pressure can be changed to affect the internal stress in the deposited material. In sputtering, for example, the temperature and the voltage of the sputtering, or in ion-assisted deposition, the ion energy, affect the stress. The importance of these residual stresses will become apparent to those skilled in the art from the following descriptions.

Referring now to FIG. 4, therein is shown the cross-sectional view of the VCSEL array of FIG. 3 in one embodiment of the present invention. The same elements in FIG. 4 have the same numbers as in FIG. 3.

The reflector support 74, which in one mode forms a plurality of different size drum-shaped configurations based on the disk-shape of the sacrificial islands 70–72, have been etched to form openings, such as sectors or holes, for removal of the sacrificial islands 70–72 by etching to create air gaps 84–86. When the sacrificial islands 70–72 are removed, the internal stresses in the upper DBRs 80–82 and in the DBR supports cause them to bow. The bows 87–89 in the reflector support 74 results in the air gaps 84–86 having different heights H1, H2, H3 at their centers due to the different diameters of the drum-shaped configurations. The heights H1, H2, H3 of the air gaps 84–86, respectively, and the thicknesses of the photoactive semiconductor structure 66 and the reflector support 74 define the optical heights of the resonant cavities of a plurality of VCODs 90–92 and, thus, the wavelengths of laser light they will emit when activated.

In different modes, the different heights H1, H2, H3 can be obtained through photolithography using a single mask to control the geometrical size and/or shape of the anchors or of the upper DBRs 80–82, or the geometrical size, shape, and/or configuration of the openings in the reflector support 74.

It will be understood that the above modes can be used separately as well as in combination on the same wafer.

Figure 5:
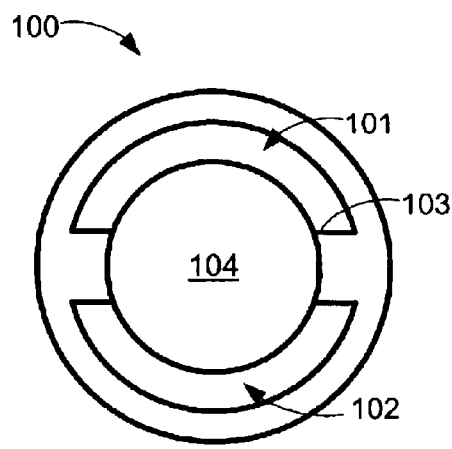
FIG. 5 is a plan view of one embodiment of a reflector support according to the present invention.

Referring now to FIG. 5, therein is shown a plan view of one embodiment of a single portion of a reflector support 100 according to the present invention. The reflector support 100 has two sector portions 101 and 102 removed to leave a single strap 103 supporting a reflector 104.

Figure 6:
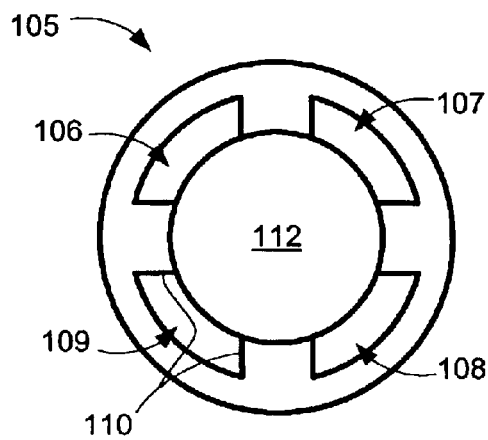
FIG. 6 is a plan view of another embodiment of a reflector support according to the present invention.

Referring now to FIG. 6, therein is shown a plan view of another embodiment of a single portion of a reflector support 105 according to the present invention. The reflector support 105 has four sectors 106–109 removed so a double strap 110 supports a reflector 112.

Figure 7:
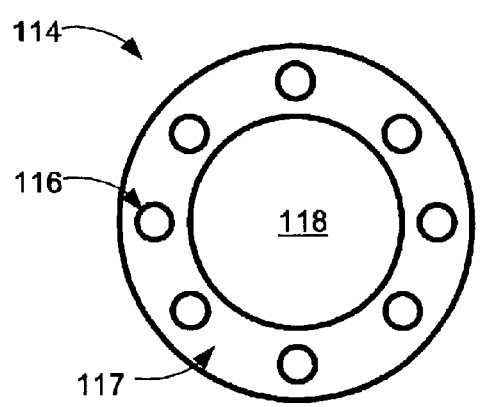
FIG. 7 is a plan view of a further embodiment of a reflector support according to the present invention.

Referring now to FIG. 7, therein is shown a plan view of a further embodiment of a single portion of a reflector support 114 according to the present invention. The reflector support 114 has a plurality of openings 116 provided therein with the remaining portion 117 supporting a reflector 118.

Figure 8:
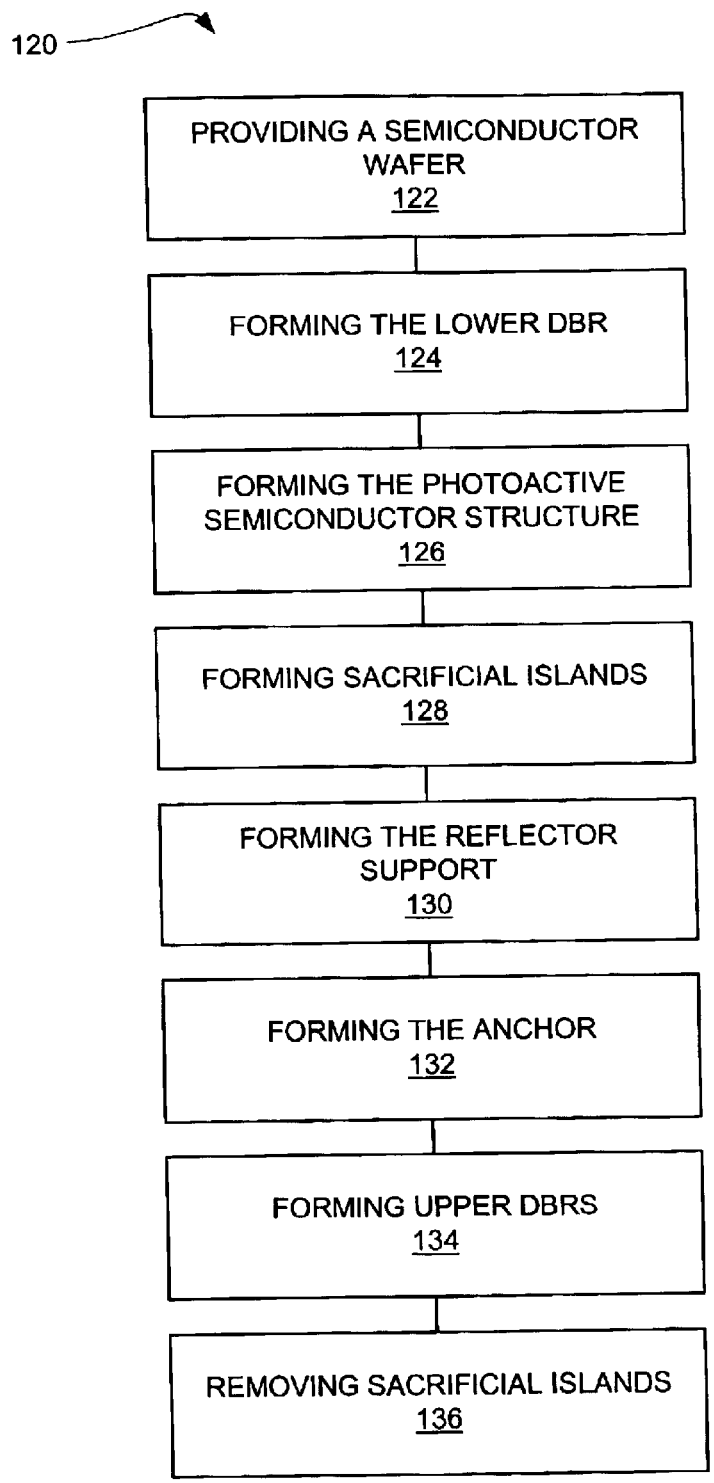
FIG. 8 is a flow chart of a method of manufacturing the present invention.

Referring now to FIG. 8, therein is shown a flow chart 120 of a method for manufacturing the monolithic VCOD array according to the present invention. A first step 122 is providing the wafer 52. A second step 124 is forming the lower DBR 64 over the wafer 52. A third step 126 is forming the photoactive semiconductor structure 66 over the lower DBR 64.

A fourth step 128 is forming first and second sacrificial islands 70 and 71 of a sacrificial layer over the photoactive semiconductor structure 66 with the first and second sacrificial islands 70 and 71 having respective first and second different sizes. If the first and second sacrificial islands 70 and 71 are disk-shaped, the first and second sacrificial islands 70 and 71 will have first and second diameters, which are different. Different size and shape sacrificial islands can be formed for the entire wafer 52 using a single mask.

A fifth step 130 involves forming the reflector support 74 over the first and second sacrificial islands 70 and 71. The reflector support 74 is conformally deposited over the first and second sacrificial islands 70 and 71 and is attached to the photoactive semiconductor structure 66 around the first and second sacrificial islands 70 and 71. It will be noted that the first and second sacrificial islands 70 and 71 are far enough apart that there is space between the first and second sacrificial islands 70 and 71 even after the reflector support 74 has been deposited. The sixth step 132 involves forming the anchor 76 between the first and second sacrificial islands 70 and 71 over the reflector support 74. Different sizes and shapes for the anchor 74 over the reflector support 74 can be formed for the entire wafer 52 using a single mask.

A seventh step 134 involves forming first and second upper DBRs 80 and 81 over the reflector support 74. This involves depositing a reflector layer and patterning and etching the reflector layer to form the first and second upper DBRs 80 and 81. Different size and shape upper DBRs can be formed for the entire wafer 52 using a single mask.

An eighth step 136 involves removing the first and second sacrificial islands 70 and 71 to form first and second air gaps 84 and 85. In this step, sectors or openings are formed in the reflector support 74 and the first and second sacrificial islands 70 and 71 are etched away through the openings to form the first and second air gaps 84 and 85. This removal step causes the first optical device 54 to be formed by the lower DBR 64, the photoactive semiconductor structure 66, the first air gap 84, and the first upper DBR 80. At the same time, a second optical device 55 is formed by the lower DBR 64, the photoactive semiconductor structure 66, the second air gap 85, and the second upper DBR 81.

The first and second air gaps 84 and 85 will be of different heights H1 and H2 due to: the stress imposed during the forming of the upper reflective layer; the geometrical size of the anchors 76 or of the first and second upper DBRs 80 and 81; or the geometrical size and configuration of the openings in the reflector support 74. The different heights H1 and H2 provide the first and second optical devices 54 and 55 with different emission wavelengths.

It will be understood that the flow chart 120 is merely exemplary and many other steps may be added and some removed as would be evident to those having ordinary skill in the art. For example, the wafer 52 can be sliced and packaged.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit of the included claims. All matters hither-to-fore set forth herein or shown in the accompanying drawings are to be interpreted in an illustrative and non-limiting sense.

What is claimed is:

1. A method for manufacturing a monolithic array of vertical cavity optical devices comprising:

forming a first reflector over a wafer;

forming a photoactive semiconductor structure over the first reflector;

forming first and second sacrificial islands of a sacrificial layer over the photoactive semiconductor structure, the first and second sacrificial islands having respective first and second configurations, the first configuration different from the second configuration;

forming a reflector support over the first and second sacrificial islands;

forming second and third reflectors over the reflector support; and removing the first and second sacrificial islands to form first and second air gaps whereby a first optical device is formed by the first reflector, the photoactive semiconductor structure, the first air gap, and the second reflector and whereby a second optical device is formed by the first reflector, the photoactive semiconductor structure, the second air gap, and the third reflector.

2. The method for manufacturing a monolithic array of vertical cavity optical devices as claimed in claim 1 wherein:

removing the first and second sacrificial islands forms the first and second vertical cavity optical devices to provide different wavelengths of light.

3. The method for manufacturing a monolithic array of vertical cavity optical devices as claimed in claim 1 wherein:

forming the second and third reflectors includes using a single mask to control the geometrical configuration of the second and third reflectors, the second and third reflectors having different geometrical configurations; and removing the first and second sacrificial islands includes forming the first and second vertical cavity optical devices with the first and second air gaps of different heights due to different geometrical configurations of the second and third reflectors.

4. The method for manufacturing a monolithic array of vertical cavity optical devices as claimed in claim 1 wherein:

forming the reflector support using a single mask to control the geometrical configuration of the reflector support; and removing the first and second sacrificial islands forms the first and second vertical cavity optical devices with the first and second air gaps of different heights due to the geometrical configuration of the reflector support.

5. The method for manufacturing a monolithic array of vertical cavity optical devices as claimed in claim 1 including:

forming an anchor between the first and second sacrificial islands on the reflector support using a single mask to control the geometrical configuration of the anchor.

and wherein:

removing the first and second sacrificial islands forms the first and second vertical cavity optical devices with the first and second air gaps of different heights due to the geometrical configuration of the anchor.

6. A method for manufacturing a monolithic array of vertical cavity optical devices comprising:

forming a first distributed Bragg reflector over a single wafer forming a photoactive semiconductor structure over the first distributed Bragg reflector;

forming first and second sacrificial islands of a sacrificial layer over the photoactive semiconductor structure, the first and second sacrificial islands having respective first and second sizes, the first size different from the second size;

forming a reflector support over the first and second sacrificial islands;

forming second and third distributed Bragg reflectors over the reflector support;

forming openings in the reflector support; and removing the first and second sacrificial islands through the. openings in the reflector support to form first and second air gaps whereby a first optical device is formed by the first distributed Bragg reflector, the photoactive semiconductor structure, the first air gap, and the second distributed Bragg reflector and whereby a second optical device is fanned by the first distributed Bragg reflector, the photoactive semiconductor structure, the second air gap, and the third distributed Bragg reflector.

7. The method for manufacturing a monolithic array of vertical cavity optical devices as claimed in claim 6 wherein:

removing the first and second sacrificial islands forms the first and second vertical cavity optical devices with the first and second air gaps having different heights and providing different wavelengths of laser light.

8. The method for manufacturing a monolithic array of vertical cavity optical devices as claimed in claim 6 wherein:

forming the second and third distributed Bragg reflectors using a single mask to control the geometrical sizes of the second and third distributed Bragg reflector, the second and third distributed Bragg reflectors having different from the geometrical sizes; and removing the first and second sacrificial islands forms the first and second vertical cavity optical devices with the first and second air gaps of different heights due to different geometrical sizes of the second and third reflectors.

9. The method for manufacturing a monolithic array of vertical cavity optical devices as claimed in claim 6 wherein:

forming the reflector support using a single mask to control the geometrical sizes and configurations of different portions of the reflector support; and removing the first and second sacrificial islands forms the first and second vertical cavity optical devices with the first and second air gaps of different heights due to the geometrical sizes of the different portions of the reflector support.

10. The method for manufacturing a monolithic array of vertical cavity optical devices as claimed in claim 6 including:

forming an anchor between the first and second sacrificial islands on the reflector support using a single mask to control the geometrical sizes of different portions of the anchor.

and wherein:

removing the first and second sacrificial islands forms the first and second vertical cavity optical devices with the first and second air gaps of different heights due to the geometrical sizes of the different portions of the anchor.

* * * * *